US011137808B2

(12) United States Patent
Nowell et al.

(10) Patent No.: US 11,137,808 B2
(45) Date of Patent: Oct. 5, 2021

(54) TEMPERATURE COMPENSATION IN A MEMORY SYSTEM

(71) Applicant: Micron Technology, Inc., Boise, ID (US)

(72) Inventors: Shane Nowell, Boise, ID (US); Sampath K. Ratnam, Boise, ID (US); Vamsi Pavan Rayaprolu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 16/119,541

(22) Filed: Aug. 31, 2018

(65) Prior Publication Data

US 2020/0073451 A1 Mar. 5, 2020

(51) Int. Cl.
*G11C 11/06* (2006.01)
*G06F 1/20* (2006.01)
*G06F 1/3234* (2019.01)
*G11C 11/56* (2006.01)

(52) U.S. Cl.
CPC ............ *G06F 1/206* (2013.01); *G06F 1/3275* (2013.01); *G11C 11/5628* (2013.01)

(58) Field of Classification Search
CPC .................................... G06F 1/20; G06F 1/32
See application file for complete search history.

(56) References Cited

U.S. PATENT DOCUMENTS

| | | | |
|---|---|---|---|
| 9,384,846 B1 | 7/2016 | Shim et al. | |
| 9,666,249 B1 | 5/2017 | Park | |
| 2008/0159019 A1* | 7/2008 | Sutardja | G11C 11/5628 365/189.16 |
| 2010/0157672 A1* | 6/2010 | Barkley | G11C 7/04 365/185.03 |
| 2015/0194191 A1* | 7/2015 | Luthra | G11C 16/10 365/191 |
| 2016/0172051 A1 | 6/2016 | Liang et al. | |
| 2018/0061504 A1 | 3/2018 | Kim et al. | |
| 2018/0335813 A1* | 11/2018 | Zhang | G11C 7/04 |

FOREIGN PATENT DOCUMENTS

JP 2013-080540 A 5/2013

OTHER PUBLICATIONS

International Search Report and Written Opinion for International Application No. PCT/US2019/048383, dated Dec. 17, 2019, 10 pages.

* cited by examiner

*Primary Examiner* — Paul B Yanchus, III
(74) *Attorney, Agent, or Firm* — Lowenstein Sandler LLP (57) ABSTRACT

A processing device in a memory system receives a data access request identifying a memory cell in a first segment of the memory system comprising at least a portion of at least one memory device. The processing device determines a temperature difference between a current temperature associated with the memory cell and a baseline temperature of the memory system and identifies a temperature compensation value specific to the first segment of the memory system, the temperature compensation value corresponding to the temperature difference. The processing device adjusts, based on an amount represented by the temperature compensation value, an access control voltage applied to the memory cell.

20 Claims, 6 Drawing Sheets

TEMPERATURE COMPENSATION IN A MEMORY SYSTEM

TECHNICAL FIELD

The present disclosure generally relates to a memory system, and more specifically, relates to temperature compensation in a memory system.

BACKGROUND

A memory system can be a storage system, such as a solid-state drive (SSD) and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to providing temperature compensation in a memory system at a particular level of granularity, such as at a per die level. An example of a memory system is a storage system, such as a solid-state drive (SSD). In some embodiments, the memory system is a hybrid memory/storage system. In general, a host system can utilize a memory system that includes one or more memory devices. The memory devices can include non-volatile memory devices, such as, for example, negative-and (NAND). The host system can provide data to be stored at the memory system and can request data to be retrieved from the memory system.

The memory system can store the data at memory cells of a memory device included in the memory system. Each of the memory cells can store one or more bits of binary data corresponding to the data received from the host system. In one example, the memory devices of the storage system can include a single-level-cell (SLC) memory where each memory cell of the SLC memory can be programmed with a single bit of data. When storing one bit of data in the SLC memory, a range of possible voltage levels of a memory cell is divided into two ranges. For example, the two ranges can include a first threshold voltage range that corresponds to the logical data value "1" and a second threshold voltage range that corresponds to the logical data value "0."

Some storage systems can include higher density memory devices such as multi-level-cell (MLC) memory that is programmed by storing 2 bits per memory cell, 3 bits per memory cell, 4 bits per memory cell, or more bits per memory cell. Data can be stored at an MLC memory based on a total voltage range that is divided into some number of distinct threshold voltage ranges for the memory cells. Each distinct threshold voltage range corresponds to a predetermined value for the data stored at the memory cell.

One type of memory device includes a quad-level cell (QLC) memory. In QLC memory, each memory cell can store four bits of data. For example, in a QLC memory, a memory cell can store four bits of data (e.g., 1111, 0000, 1101, etc.) corresponding to data received from the host system. In QLC memory, each bit of the memory cell is stored at a different portion (also referred to as a "page" hereafter) of the memory cell. A memory cell of the QLC memory can have a total of four pages. For example, the memory cell can include a lower page (LP), an upper page (UP), an extra page (XP) and a top page (TP), where each page stores a bit of data. For example, a bit can be represented by each of the four pages of the memory cell. In a memory cell for a QLC memory, each combination of four bits can correspond to a different threshold voltage range (also referred to as a "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

Conventional storage systems can store multiple bits of data in a single memory cell by mapping a sequence of bits to each of the different voltage levels of the memory cell. For example, a particular logical data value (e.g., '1100') can be assigned to one voltage level and another logical data value (e.g., '1010') can be assigned to another voltage level of the memory cell. The data can be stored into the memory cell by using a programming operation that applies a sequence of programming pulses to the memory cell. The sequence of programming pulses can be applied to the memory cell until a voltage level corresponding to the data value has been reached at the memory cell. After the memory cell has been programmed, data can be read from the memory cell by applying a read voltage to the memory cell at the corresponding threshold voltage range and translating the programmed voltage level at the memory cell.

Under certain circumstances, the storage system can be operated in an environment with varying temperature (e.g., between 0 to 70 degrees Celsius (° C.)). Even minor temperature variations over time, such as a period of time between when data is written to a memory cell and when data is read from the memory cell, can impact the voltages stored in and read from the memory cell. For example, if a memory cell in a QLC memory is written with a voltage level of 2 V corresponding to a data value of '0100' at 25° C., and the temperature changes over time to 27° C. when the memory cell is read, the apparent voltage level may have shifted to 1.85 V. Depending on how the threshold voltage ranges (i.e., levels) are defined in the memory cell, the apparent read voltage may reflect a different data value (e.g., '0011'). This shift can result in increased raw bit error rate (RBER) which can be beyond the error correction capability of the underlying error correction code (ECC).

In addition, an amount that the voltage shifts may change as the change in temperature increases over time. In other words, the voltage shift per degree Celsius may be larger at extreme temperatures (e.g., closer to 0° C. or 70° C.) than it is in a more moderate range (e.g., 15° C. to 30° C.). Furthermore, manufacturing variations in memory cells and memory devices can cause different memory cells to be affected by temperature variations in different ways. For example, one memory cell, or group of memory cells, may be exhibit a read voltage shift for a given temperature change that is larger than the read voltage shift exhibited by another memory cell, or group of memory cells, for the same change in temperature.

Aspects of the present disclosure address the above and other considerations by providing temperature compensation in the memory system at a particular level of granularity, such as at a per die level. A semiconductor die is an individual segment of semiconducting material on which functional circuits are fabricated. Each die may include a separate memory device organized into multiple memory blocks, and there may be multiple die included in a single memory system. Depending on the manufacturing process, the memory cells on a particular die may exhibit relatively similar behavior with respect to voltage shift in response to changes in temperature. In general, the voltage shift in response to a change in temperature for one memory cell is likely to be more similar to the voltage shift of another cell on the same die, than to the voltage shift of a memory cell that is on a different die.

Accordingly, in one embodiment, the memory system can determine a separate temperature compensation ("tempco") value for each die in the memory system. The temperature compensation value can be used to adjust the read voltage of a memory cell to account for any change in temperature between the time when the memory cell is read and the time when the memory cell was programmed. By using a temperature compensation value that is more specifically calibrated to the particular memory cells being read (i.e., for the particular die holding the memory cells), rather than using a general compensation value for the entire memory system, more accurate temperature compensation and read values can be achieved. In other embodiments, a temperature compensation value for some other level of granularity can be used, such as a per cell, per row/column, per layer, per block, per drive, per package, or per device compensation value. As a result, the error rate in the memory system can be decreased, error correction code can be utilized less frequently, and overall performance of the memory system can be improved. Additional details of these temperature compensation techniques are provided below with respect to FIGS. 1-6.

Figure 1:
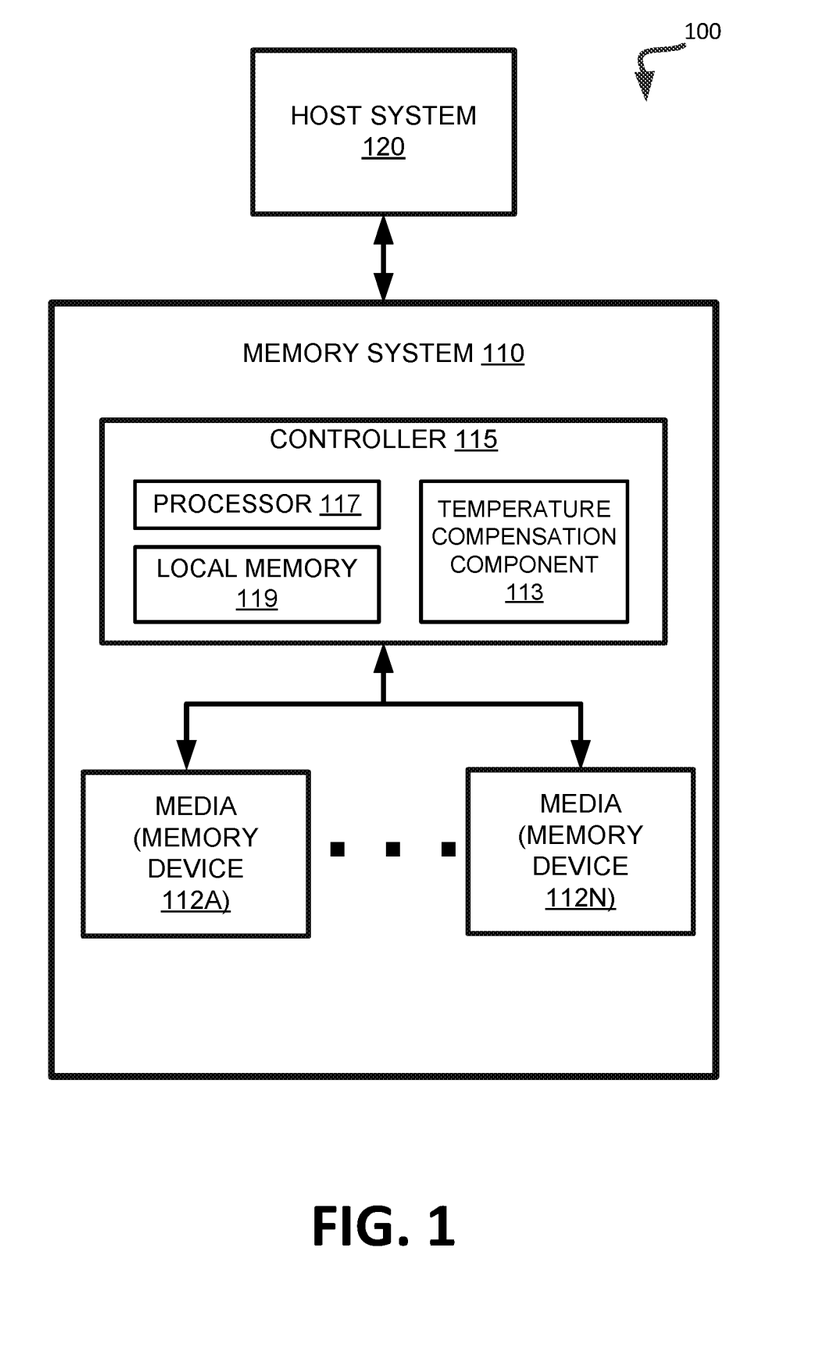
FIG. 1 illustrates an example computing environment that includes a memory system in accordance with some embodiments of the present disclosure.

FIG. 1 illustrates an example computing environment 100 that includes a memory system 110 in accordance with some embodiments of the present disclosure. The memory system 110 can include media, such as memory devices 112A to 112N. The memory devices 112A to 112N can be volatile memory devices, non-volatile memory devices, or a combination of such devices. In some embodiments, the memory system is a storage system. One example of a storage system is an SSD. The computing environment 100 can include a host system 120 that accesses the memory system 110 to store or retrieve data. In some embodiments, the host system 120 can write data to the memory system 110 and read data from the memory system 110. In some embodiments, the memory system 110 is a hybrid memory/storage system.

The host system 120 can be a computing device such as a desktop computer, laptop computer, network server, mobile device, or other such computing device that includes a memory and a processing device. The host system 120 can include or be coupled to the memory system 110 so that the host system 120 can read data from or write data to the memory system 110. The host system 120 can be coupled to the memory system 110 via a physical host interface. As used herein, "coupled to" refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory system 110. The host system 120 can further utilize an NVM Express (NVMe) interface to access the memory devices 112A to 112N when the memory system 110 is coupled with the host system 120 by the PCIe interface. The physical host interface can provide an interface for passing control, address, data, and other signals between the memory system 110 and the host system 120.

The memory devices 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs) or multi-level cells (MLCs) (e.g., triple level cells (TLCs) or quad-level cells (QLCs)). In some embodiments, a particular memory device can include both an SLC portion and a MLC portion of memory cells. Each of the memory cells can store bits of data (e.g., data blocks) used by the host system 120. Although non-volatile memory devices such as NAND type flash memory are described, the memory devices 112A to 112N can be based on any other type of memory such as a volatile memory. In some embodiments, the memory devices 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The controller 115 can communicate with the memory devices 112A to 112N to perform operations such as reading data, writing data, or erasing data at the memory devices 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory system 110, including handling communications between the memory system 110 and the host system 120. In some embodiments, the local memory 119 can include memory registers storing, e.g., memory pointers, fetched data, etc. The local memory 119 can also include read-only memory (ROM) for storing micro-code. While the example memory system 110 in FIG. 1 has been illustrated as including the controller 115, in another embodiment of the present disclosure, a memory system 110 may not include a controller 115, and can instead rely upon external control (e.g., provided by an external host, or by a processor or controller separate from the memory system).

The controller 115 can receive commands or operations from the host system 120 and can convert the commands or operations into instructions or appropriate commands to achieve the desired access to the memory devices 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory devices 112A to 112N. The controller 115 can further include host interface circuitry to communicate with the host system 120 via the physical host interface. The host interface circuitry can convert the commands received from the host system into command instructions to access the memory devices 112A to 112N as well as convert responses associated with the memory devices 112A to 112N into information for the host system 120.

The memory system 110 can include a temperature compensation component 113 that can be used to determine temperature compensation values for the memory system 110 at varying levels of granularity, such as a per die temperature compensation value. The temperature compensation component 113 can further apply the temperature compensation values during data access operations on the memory devices 112A to 112N, such as read or write operations, to account for voltage shifts attributable to changes in temperature over time. In one embodiment, temperature compensation component 113 receives a data access request, such as a read request from host system 120, identifying a multi-level memory cell in a first segment of the memory system 110. The first segment may include, for example, an individual semiconductor die comprising at least a portion of one of a plurality of memory devices 112A to 112N. The temperature compensation component 113 can determine a temperature difference between a current temperature associated with the multi-level memory cell and a baseline temperature of the memory system 110 and identifies a temperature compensation value specific to the first segment of the memory system 110. The temperature compensation value can be based on specific characteristics of the semiconductor die formed during fabrication of the memory devices and can correspond to the particular temperature difference. In one embodiment, temperature compensation component 113 adjusts an access control voltage applied to the multi-level memory cell by an amount represented by the temperature compensation value to account for any voltage drift attributable to the temperature difference.

The memory system 110 can also include additional circuitry or components that are not illustrated. In some embodiments, the memory system 110 can include a cache or buffer (e.g., DRAM) and address circuitry (e.g., a row decoder and a column decoder) that can receive an address from the controller 115 and decode the address to access the memory devices 112A to 112N.

Figure 2:
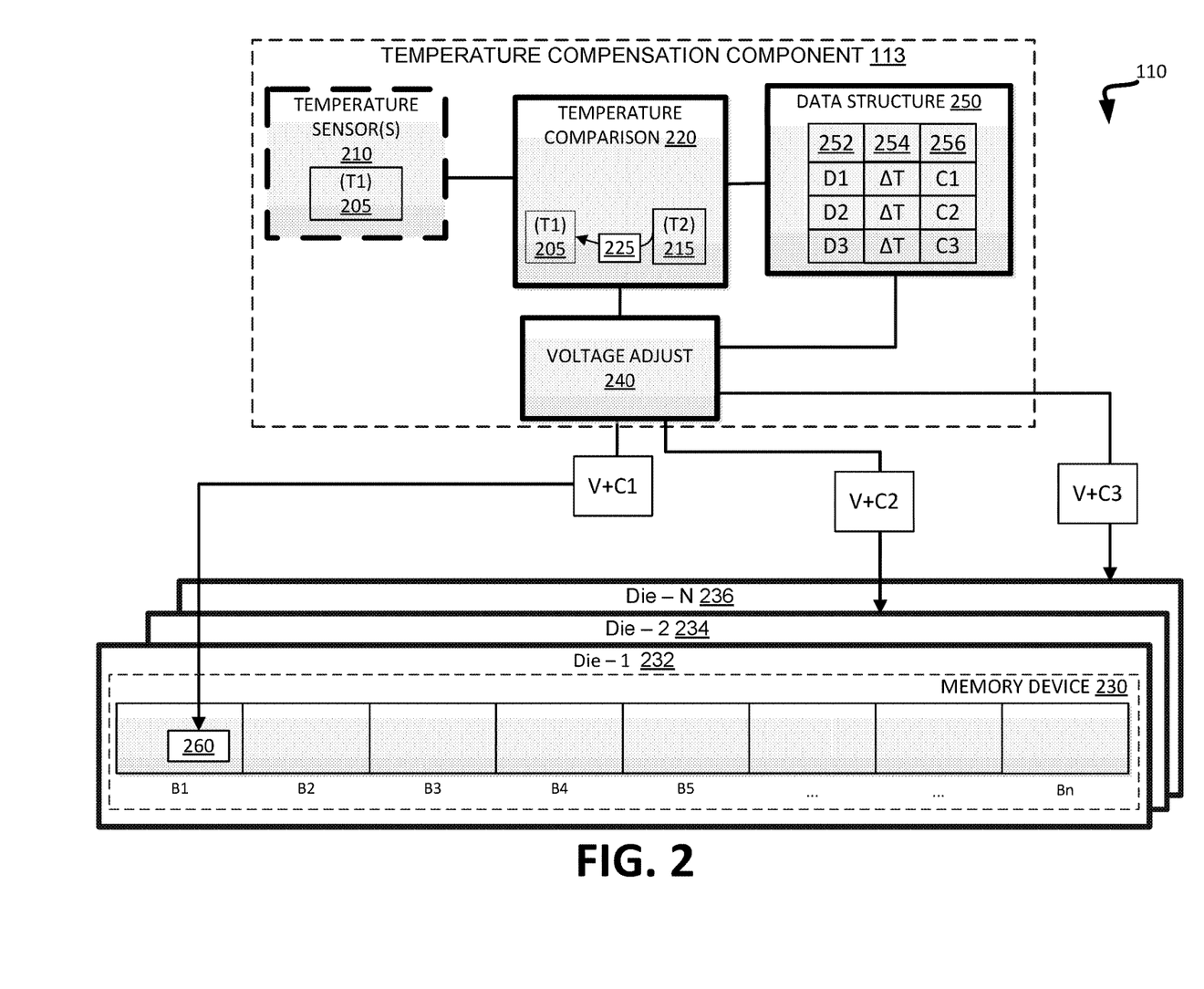
FIG. 2 illustrates a memory system that includes temperature compensation on a per die level in accordance with some embodiments of the present disclosure.

FIG. 2 illustrates a memory system that includes temperature compensation on a per die level in accordance with some embodiments of the present disclosure. The memory system 110 can correspond to the memory system 110 illustrated in FIG. 1. For example, the memory system 110 can include temperature compensation component 113 of FIG. 1. In some embodiments, the temperature compensation component 113 can be configured to retrieve temperature measurements associated with a memory device 230. The temperature compensation component 113 can further be configured to perform temperature compensation on a per-die level based on the temperature measurements.

As shown, the memory device 230 can be organized into one or more blocks B 1-$n$. The blocks B 1-$n$ each include multiple memory pages that can correspond to portions of the memory device 230. The size and configuration of the blocks B 1-$n$ can vary. For example, each of the blocks B 1-$n$ can include any number of memory pages, and each memory page can have an associated storage capacity for storing data. In one embodiment, each memory page can include a number of single-level or multi-level memory cells, such as multi-level memory cell 260. In one embodiment, the memory system 110 can include one or more dies 232, 234 and 236. Each die may include a small block of semiconducting material on which functional circuits are fabricated. Each die may include a separate memory device, such as memory device 230, organized into multiple memory blocks. As shown, semiconductor die 232 includes memory device 230, which includes one or more of data blocks B 1-$n$.

Data can be programmed, read, and/or erased from the memory pages of the blocks B 1-$n$. In some implementations, the memory pages can correspond to a group of memory cells that are read and/or programmed together, such as multi-level memory cell 260. The memory cells can be programmed using an iterative programming process. In this type of process, a sequence of programming pulses is applied to a group of memory cells until the desired voltage levels in the memory cells is reached. Once the memory cells have been programmed, data can be read from the memory cells by translating the programmed voltage level of the memory cells.

In some embodiments, the temperature compensation component 113 can determine a temperature at which the memory system 110 is operating. Temperature information for the storage system 200 can be obtained when programming or reading the memory device 230 and used to adjust certain data access operations. In response to detecting that there is a change in the temperature, the temperature compensation component 113 can adjust an access control voltage using a temperature compensation value when programming or reading the memory cells of memory device 230.

Temperature information associated with the memory device 230 can be obtained in several ways. For example, the temperature information can include temperature measurements T1 205 from one or more temperature sensors 210 located in and around memory device 230 and/or temperature measurements from other temperature sensors that are associated with other components of memory system 110 (e.g., controller 115). The temperature compensation component 113 can obtain temperature measurements T1 205 from the temperature sensors 210 to determine whether the memory system 110 is operating at a temperature different than a baseline temperature T2 215. In some implementations, the temperature sensors 210 can be configured to periodically and at predefined intervals measure the temperature T1 205 and to provide an indication of the measured temperature T1 205 to the temperature compensation component 113. In other implementations, the temperature sensors 210 can measure the temperature T1 205 responsive to one or more commands that can be sent by the controller 115, such as a command to measure temperature T1 205. Depending on the embodiment, the current temperature T1 205 can include at least one of a temperature of the semiconductor die 232 on which memory device 230 is fabricated, an operating temperature of the storage system 110 (e.g., obtained from controller 115), or an ambient temperature in an area where memory system 110 is located.

The temperature compensation component 113 can also perform temperature comparison operation 220 to determine whether the memory system 110 is operating at a temperature different than a baseline temperature (e.g., 25° C.). For example, the temperature comparison operation 220 can compare the current temperature T1 205 to a preset baseline temperature T2 215 associated with the memory system 110. The baseline temperature T2 215 can be a preset temperature specification for the memory system 110. The preset temperature specification can indicate an optimal or expected operating temperature for the memory system 110, or a range of such temperatures.

To compare the two temperatures, the temperature comparison operation 220 can determine a difference 225 between the current temperature T1 205 and the baseline temperature T2 215. The difference 225 can be used to determine whether there has been a change in the operating temperature of memory system 110. In one embodiment, all or some of the temperatures can be normalized to the baseline temperature T2 215. For example, two temperatures from different points in time (e.g., a temperature when memory cell 260 is programmed and a temperature when memory cell 260 is read) can be related to one another based on their relative differences from the baseline temperature T2 215.

Upon detecting a difference 225 in temperature between the current temperature T1 205 and the baseline temperature T2 215, a voltage adjust operation 240 can identify a temperature compensation value specific to a first segment of the memory system 110 (e.g., the die on which memory device 230 is fabricated). This temperature compensation value can correspond to the temperature difference 225 determined from the temperature comparison operation 220. In one embodiment, each segment (e.g., each of dies 232, 234, and 236) of memory system 110 may have a number of corresponding temperature compensation values, where each temperature compensation value is associated with a different temperature difference 225 between the current temperature T1 205 and the baseline temperature 215. The voltage adjust operation 240 can use the identified corresponding temperature compensation value to adjust an access control voltage applied to multi-level memory cell 260 by a particular voltage level represented by the temperature compensation value. This adjustment to the access control voltage can account for any voltage shift attributable to the temperature difference 225, so that the logical data value read from the multi-level memory cell 260 can be accurately determined without any errors. Given the current manufacturing techniques for semiconductor devices, each semiconductor die may have subtly different characteristics. As such, each die may have a specific corresponding temperature compensation value that is based on the specific characteristics of the semiconductor die formed during fabrication of a respective memory device on the semiconductor die.

To track the die-to-die variability for each die, the temperature compensation component 113 can generate and manage a data structure such as a data structure 250. In one embodiment, temperature compensation component 113 creates data structure 250 when memory system 110 is in an initial testing phase and populates data structure 250 with values determined during the initial testing phase. The data structure 250, which can be a table for example, and can include a number of entries for a segment of memory system 110 (e.g., each of dies 232, 234, and 236), where each of the entries includes information associated with the fields 252, 254, and 256. For example, the data structure 250 can include a first field 252 to identify a particular die, a second field 254 to identify a particular temperature difference from the baseline temperature T2 215, and a third field 256 to identify the corresponding temperature compensation value associated with the die and that particular temperature difference.

During a data access operation, voltage adjust operation 240 can access data structure 250 to identify the appropriate temperature compensation value based on the die being accessed and the temperature difference 225. For example, the temperature difference 225 can be used as an index to retrieve the temperature compensation value from the data structure 250. The data structure 250 provides the temperature compensation values at varying levels of granularity for adjusting an access control voltage signal V as the temperature varies (e.g., at a per-die level of granularity). For example, if the temperature difference 225 is 5° C., a particular temperature compensation value C1 can be selected for a first die D1 (i.e., V+C1). If the temperature difference 225 is 8° C., a different temperature compensation value C2 can be selected for a second die D2 (i.e., V+C2). If the temperature difference 225 is 10° C., a different temperature compensation value C3 can be selected for a third die D3 (i.e., V+C3). In one embodiment, there can be multiple entries in data structure 250 for a particular die, where each entry contains a different temperature compensation value for a different temperature difference.

Figure 3:
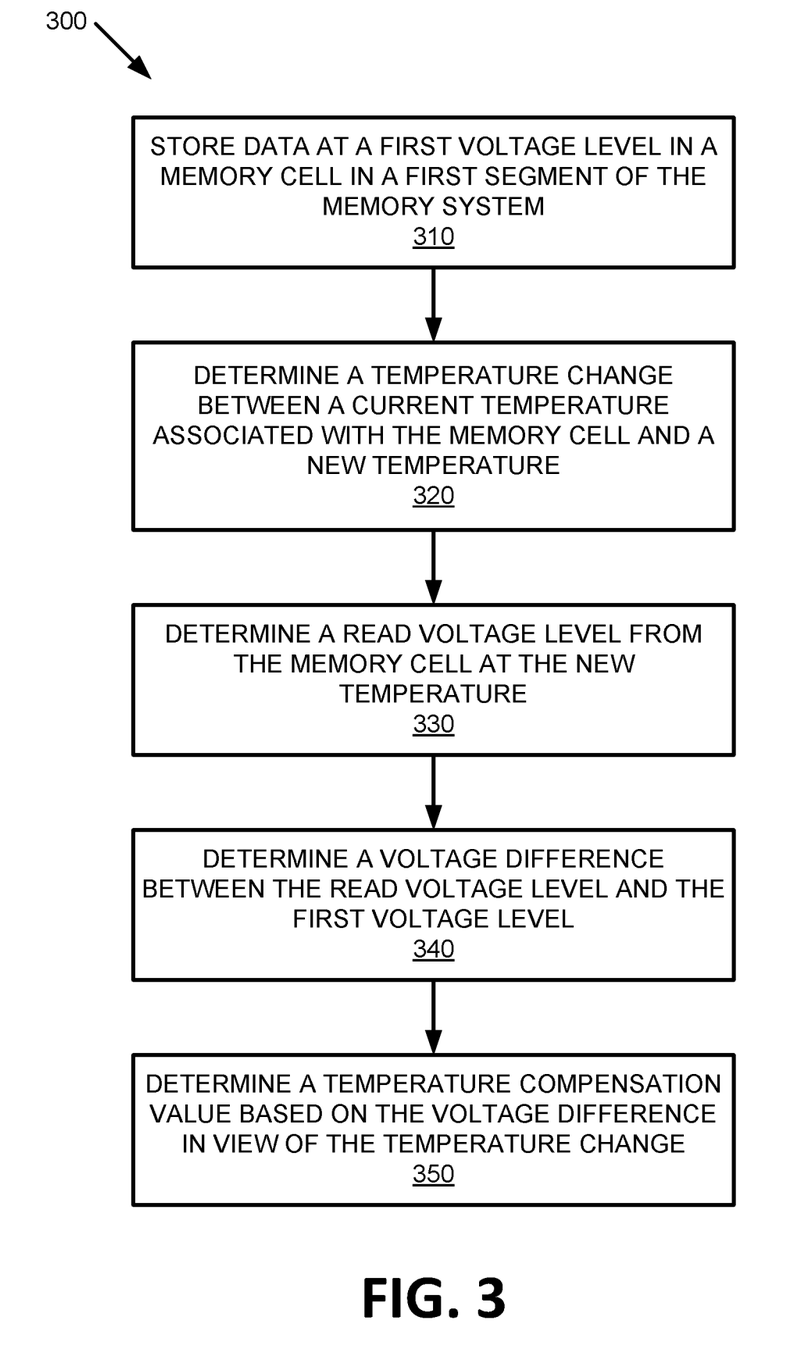
FIG. 3 is a flow diagram of an example method to determine a segment specific temperature compensation value, in accordance with some embodiments of the present disclosure.

FIG. 3 is a flow diagram of an example method 300 to determine a segment specific temperature compensation value, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the temperature compensation component 113 of FIGS. 1 and 2. In another embodiment, the method 300 can be performed by a host system (e.g., host system 120 of FIG. 1) having access to modify parameters of the memory system 110.

At block 310, a processing device stores data at a first voltage level in either a singled-level memory cell or a multi-level memory cell 260 in a first segment of the memory system 110. In one embodiment, the first segment comprises a semiconductor die 232 on which one of a plurality of memory devices 230 having the multi-level memory cell 260 is fabricated. In one embodiment, temperature compensation component 113, or another component of controller 115, stores the data into the memory cell 260 by using a programming operation that applies a sequence of programming pulses to the memory cell 260. The sequence of programming pulses can be applied to the memory cell 260 until a voltage level corresponding to the data value has been reached at the memory cell 260. In one embodiment, memory cell 260 is a memory cell for a QLC memory where each combination of four bits can correspond to a different threshold voltage level. Because the memory cell 260 includes 4 bits of data, there are a total of 16 different voltage levels.

At block 320, a processing device determines a temperature change between a current temperature associated with the multi-level memory cell and a new temperature. In one embodiment, the current temperature can include temperature measurements T1 205 from one or more temperature sensors 210 located in and around memory device 230 and/or temperature measurements from other temperature sensors that are associated with other components of memory system 110 (e.g., controller 115). The temperature compensation component 113 can obtain temperature measurements T1 205 from the sensors 210 to determine whether the memory system 110 is operating at a temperature different than a baseline temperature T2 215. Depending on the embodiment, the current temperature T1 205 can include at least one of a temperature of the semiconductor die 232 on which memory device 230 is fabricated, an operating temperature of the memory system 110 (e.g., obtained from controller 115), or an ambient temperature in an area where memory system 110 is located. The new temperature can be some arbitrarily chosen temperature either above or below the current temperature to be used for comparison purposes. In one embodiment, the new temperature is a temperature a set amount above or below the current temperature (e.g., +/−5° C.). To compare the two temperatures, the temperature comparison operation 220 can determine a difference 225 between the current temperature T1 205 and the baseline temperature T2 215. The difference 225 can be used to determine whether there has been a change in the operating temperature of memory system 110.

At block 330, a processing device determines a read voltage level from the multi-level memory cell at the new temperature. In one embodiment, temperature compensation component 113 can read data from the memory cell 260 by applying a read voltage to the memory cell at a corresponding threshold voltage range, such as by applying an access control voltage signal, and translating the read voltage level at the memory cell. To determine the read voltage level, temperature compensation component 113 measures an amount of current flow through the multi-level memory cell 260 when the access control voltage is applied to a control gate of the multi-level memory cell 260.

At block 340, a processing device determines a voltage difference between the read voltage level and the first voltage level. In one embodiment, temperature compensation component 113 compares the read voltage level to the first voltage level originally programmed into multi-level memory cell 260 to determine a difference between the voltages. The read voltage level can be the same as the first programmed voltage level, but voltage shift can occur over time due to the change in temperature between the time when the memory cell is read and the time when the memory cell was programmed. For example, an increase of 1° C. can result in a decrease of approximately 6 millivolts.

At block 350, a processing device determines a temperature compensation value based on the voltage difference in view of the temperature change. In one embodiment, temperature compensation component 113 divides the voltage difference determined at block 340 by the temperature change identified at block 320 to determine a ratio which can be used as the temperature compensation value. This temperature compensation value is specific to die 232 containing multi-level memory cell 260. In one embodiment, temperature compensation component 113 can repeat the operations of blocks 310-350 for a plurality of memory cells across different blocks of die 232 to determine a number of different temperature compensation values. These temperature compensation values can be combined together (e.g., averaged) to determine a representative temperature compensation value for the die 232. The voltage shift in response to a change in temperature for one memory cell is likely to be more similar to the voltage shift of another cell on the same die 232, than to the voltage shift of a memory cell that is on a different die 234 or 236. In other embodiments, a temperature compensation value for some other level of granularity can be determine, such as a per cell, per row/column, per layer, per block, per drive, per package, or per device compensation value. In one embodiment, temperature compensation component 113 stores the temperature compensation value or values in data structure 250 or in some other metadata location in memory system 110 for later use.

Figure 4:
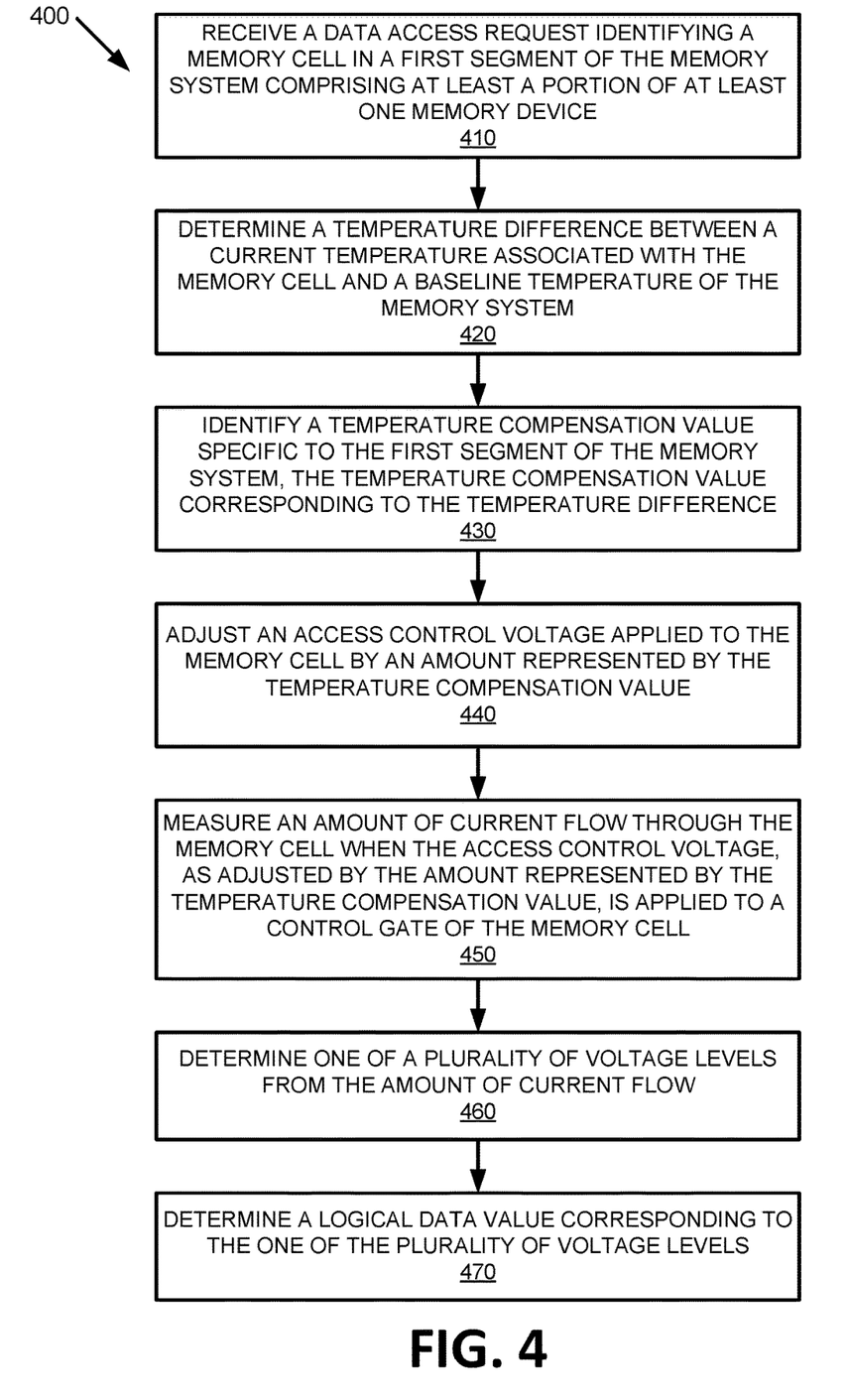
FIG. 4 is a flow diagram of an example method 400 to perform temperature compensation on a per-die basis in a memory system, in accordance with some embodiments of the present disclosure.

FIG. 4 is a flow diagram of an example method 400 to perform temperature compensation on a per-die basis in a memory system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the temperature compensation component 113 of FIGS. 1 and 2. In another embodiment, the method 400 can be performed by a host system (e.g., host system 120 of FIG. 1) having access to modify parameters of the memory system 110.

At block 410, a processing device receives a data access request identifying at least one of a single-level memory cell or a multi-level memory cell in a first segment of the memory system comprising at least a portion of one of a plurality of memory devices. In one embodiment, the data access request comprises one of a read request or a write/program request received from host system 120.

At block 420, a processing device determines a temperature difference between a current temperature associated with the memory cell and a baseline temperature of the memory system. In one embodiment, the current temperature can include temperature measurements T1 205 from one or more temperature sensors 210 located in and around memory device 230 and/or temperature measurements from other temperature sensors that are associated with other components of memory system 110 (e.g., controller 115). The temperature compensation component 113 can obtain temperature measurements T1 205 from the sensors 210 to determine whether the memory system 110 is operating at a temperature different than a baseline temperature T2 215. Depending on the embodiment, the current temperature T1 205 can include at least one of a temperature of the semiconductor die 232 on which memory device 230 is fabricated, an operating temperature of the memory system 110 (e.g., obtained from controller 115), or an ambient temperature in an area where memory system 110 is located. To compare the two temperatures, the temperature comparison operation 220 can determine a difference 225 between the current temperature T1 205 and the baseline temperature T2 215. The difference 225 can be used to determine whether there has been a change in the operating temperature of memory system 110.

At block 430, a processing device identifies a temperature compensation value specific to the first segment of the memory system, the temperature compensation value corresponding to the temperature difference. During a data access operation, voltage adjust operation 240 can access data structure 250 to identify the appropriate temperature compensation value based on the die being accessed and the temperature difference 225. For example, the temperature difference 225 can be used as an index to retrieve the temperature compensation value from the data structure 250. The data structure 250 provides the temperature compensation values at varying levels of granularity for adjusting an access control voltage signal V as the temperature varies (e.g., at a per-die level of granularity).

At block 440, a processing device adjusts an access control voltage applied to the memory cell by an amount represented by the temperature compensation value. In one embodiment, voltage adjust operation 240 applies the temperature compensation value identified at block 430 to the access control voltage signal V. As a result, the access control voltage signal V may be increased or decreased (as appropriate) by an amount represented by the identified temperature compensation value.

At block 450, a processing device measures an amount of current flow through the memory cell when the access control voltage, as adjusted by the amount represented by the temperature compensation value, is applied to a control gate of the memory cell. In one embodiment, temperature compensation component 113 can read data from the memory cell 260 by applying a read voltage to the memory cell 260 at a corresponding threshold voltage range, such as by applying the adjusted access control voltage signal (e.g., V+C1) to a control gate of the memory cell 260 and measures an amount of current flow through the memory cell 260 at a floating gate. In another embodiment, temperature compensation component 113 can program data to the memory cell 260 by applying a program voltage to the memory cell 260, such as by applying the adjusted access control voltage signal to the control gate of the memory cell 260. The adjusted access control voltage ensures that the voltage level programmed to the memory cell 260 at the current temperature can be read accurately in the future either at or with respect to the baseline temperature of the memory system.

At block 460, a processing device determines one of a plurality of voltage levels from the amount of current flow. Since the memory cell 260 is configured to store a voltage at one of a plurality of voltage levels, with each of the plurality of voltage levels representing a different logical data value, the resulting read voltage will be associated with one of the levels.

At block 470, a processing device determines a logical data value corresponding to the one of the plurality of voltage levels. For example, a first level can represent '0000', a second level can represent '0001', a third level can represent '0010', and so on. Because the access control voltage was adjusted by the die-specific temperature compensation value, the occurrence of errors when decoding the read voltage level of memory cell 260 is significantly reduced.

Figure 5:
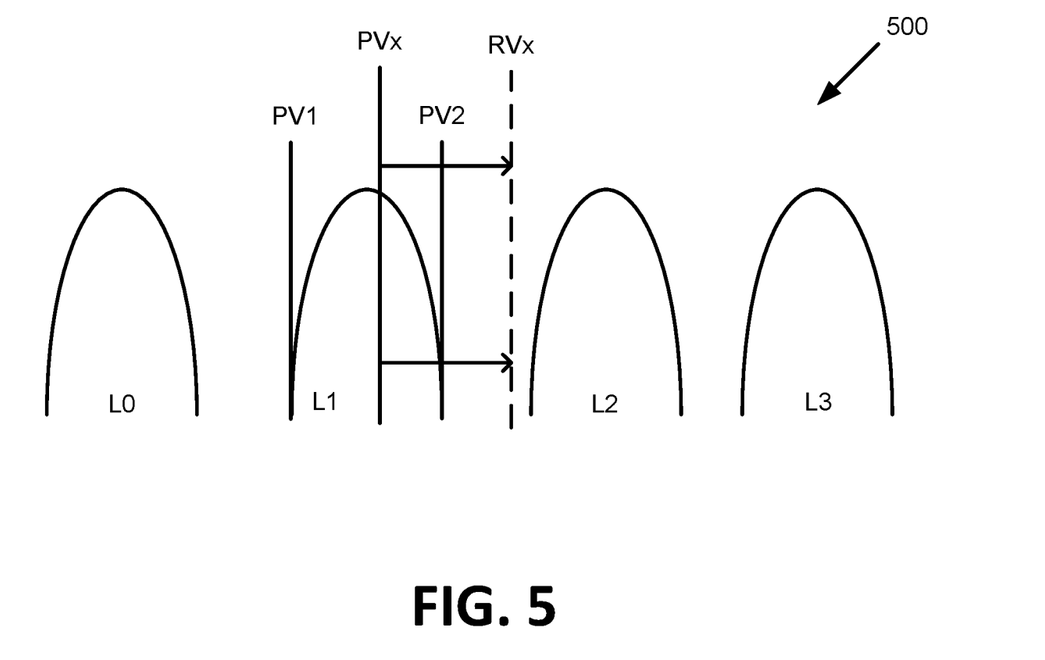
FIG. 5 illustrates an example of voltage distributions for levels of a memory cell, in accordance with one embodiment of the present disclosure.

FIG. 5 illustrates an example of voltage distributions 500 for levels of a memory cell, in accordance with one embodiment of the present disclosure. As shown, a memory cell that stores two bits of data includes four levels L0, L1, L2, and L3. In other embodiments, such as for a memory cell that stores four bits of data, the memory cell includes 16 levels L0-L15. In this example, level L1 is represented by a range of values between PV1 and PV2. As described above, the memory cell may be programmed to store the logical data value (e.g., '0001') corresponding to level L1 by applying a sequence of programming pulses to the memory cell until a program voltage level reaches the range of values between PV1 and PV2. In one embodiment, that program voltage level may be referenced by PVx. As a temperature associated with the memory cell changes over time (such as over a time period between when the memory cell is programmed and when the memory cell is read), the apparent read voltage may be affected. For example, the memory cell may experience a read voltage shift to a read voltage level RVx. Since RVx falls outside the range of values between PV1 and PV2 which define level L1, there exists the possibility of a read error. For example, the read voltage level RVx may be decoded as corresponding to level L2, which has a different associated logical data value (e.g., '0010'). In one embodiment, the die specific temperature compensation value used to adjust the access control voltage signal when reading the memory cell is designed to account for this voltage shift and cause the read voltage level RVx to remain the same as the program voltage level PVx, or at least to remain within the range of values between PV1 and PV2, such that the read voltage level RVx is still associated with level L1.

Figure 6:
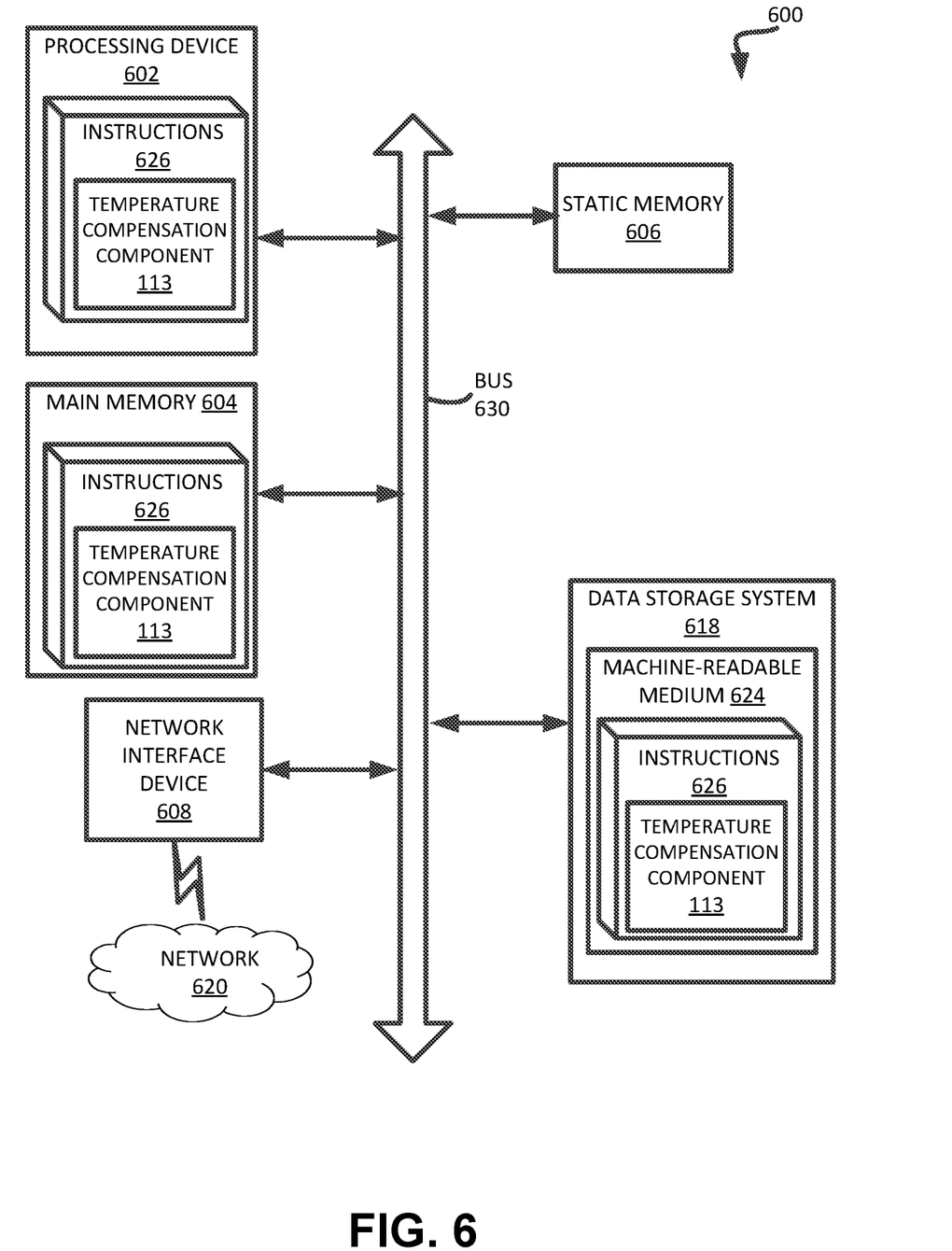
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. For example, the computer system 600 can correspond to a host system (e.g., the host system 120 of FIG. 1) that includes or utilizes a memory system (e.g., the memory system 110 of FIG. 1) or can be used to perform the operations of a controller (e.g., to execute an operating system to perform operations corresponding to the temperature compensation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions or software 626 embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory system 110 of FIG. 1.

In one embodiment, the instructions 626 include instructions to implement functionality corresponding to temperature compensation component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory system comprising:
   at least one memory device; and
   a processing device, operatively coupled with the at least one memory device, the processing device to:
      receive a data access request identifying a memory cell in a first segment of a plurality of segments of the memory system comprising at least a portion of the at least one memory device;
      determine a temperature difference between a current temperature associated with the memory cell and a baseline temperature of the memory system;

identify a first temperature compensation value corresponding to the temperature difference, wherein the first temperature compensation value comprises one of a plurality of temperature compensation values specific to the first segment of the memory system and each associated with a different temperature difference, wherein to identify the first temperature compensation value, the processing device is to access a data structure storing the plurality of temperature compensation values, wherein the plurality of temperature compensation values are based on specific characteristics of the first segment formed during fabrication of the at least one memory device; and adjust, based on an amount represented by the first temperature compensation value, an access control voltage applied to the memory cell.

2. The memory system of claim 1, wherein the first segment of the memory system comprises a semiconductor die on which the at least one memory device having the memory cell is fabricated.

3. The memory system of claim 2, wherein the current temperature associated with the memory cell comprises at least one of a temperature of the semiconductor die, an operating temperature of the memory system, or an ambient temperature.

4. The memory system of claim 1, wherein the memory cell comprises a multi-level memory cell and is configured to store a voltage at one of a plurality of voltage levels, each of the plurality of voltage levels representing a different logical data value.

5. The memory system of claim 4, wherein the data access request comprises a program request.

6. The memory system of claim 4, wherein the data access request comprises a read request, and wherein the processing device is further to:

measure an amount of current flow through the memory cell upon applying the access control voltage, as adjusted by the amount represented by the first temperature compensation value, to a control gate of the memory cell;

determine one of the plurality of voltage levels from the amount of current flow; and determine a logical data value corresponding to the one of the plurality of voltage levels.

7. The memory system of claim 1, wherein the processing device is further to determine the first temperature compensation value specific to the first segment of the memory system, wherein to determine the first temperature compensation value, the processing device to:

store data at a first voltage level in the memory cell in the first segment of the memory system;

determine a temperature change between the current temperature associated with the memory cell and a new temperature;

determine a read voltage level from the memory cell at the new temperature;

determine a voltage difference between the read voltage level and the first voltage level; and determine the first temperature compensation value based on the voltage difference in view of the temperature change.

8. A method comprising:

receiving a data access request identifying a memory cell in a first segment of a plurality of segments of a memory system comprising at least a portion of at least one memory device;

determining a temperature difference between a current temperature associated with the memory cell and a baseline temperature of the memory system;

identifying, by a processing device, a first temperature compensation value corresponding to the temperature difference, wherein the first temperature compensation value comprises one of a plurality of temperature compensation values specific to the first segment of the memory system and each associated with a different temperature difference, wherein identifying the first temperature compensation value comprises accessing a data structure storing the plurality of temperature compensation values, wherein the plurality of temperature compensation values are based on specific characteristics of the first segment formed during fabrication of the at least one memory device; and adjusting, based on an amount represented by the first temperature compensation value, an access control voltage applied to the memory cell.

9. The method of claim 8, wherein the first segment of the memory system comprises a semiconductor die on which the at least one memory device having the memory cell is fabricated.

10. The method of claim 9, wherein the current temperature associated with the memory cell comprises at least one of a temperature of the semiconductor die, an operating temperature of the memory system, or an ambient temperature.

11. The method of claim 8, wherein the memory cell comprises a multi-level memory cell and is configured to store a voltage at one of a plurality of voltage levels, each of the plurality of voltage levels representing a different logical data value.

12. The method of claim 11, wherein the data access request comprises a program request.

13. The method of claim 11, wherein the data access request comprises a read request, and the method further comprises:

measuring an amount of current flow through the multi-level memory cell upon applying the access control voltage, as adjusted by the amount represented by the first temperature compensation value, to a control gate of the multi-level memory cell;

determining one of the plurality of voltage levels from the amount of current flow; and determining a logical data value corresponding to the one of the plurality of voltage levels.

14. The method of claim 8, wherein method further comprises determining the first temperature compensation value specific to the first segment of the memory system, wherein determining the first temperature compensation value comprises:

storing data at a first voltage level in the memory cell in the first segment of the memory system;

determining a temperature change between the current temperature associated with the memory cell and a new temperature;

determining a read voltage level from the memory cell at the new temperature;

determining a voltage difference between the read voltage level and the first voltage level; and determining the temperature first compensation value based on the voltage difference in view of the temperature change.

15. A non-transitory computer-readable storage medium comprising instructions that, when executed by a processing device, cause the processing device to:

receive a data access request identifying a memory cell in a first segment of a plurality of segments of a memory system comprising at least a portion of at least one memory device;

determine a temperature difference between a current temperature associated with the memory cell and a baseline temperature of the memory system;

identify a first temperature compensation value corresponding to the temperature difference, wherein the first temperature compensation value comprises one of a plurality of temperature compensation values specific to the first segment of the memory system and each associated with a different temperature difference, wherein to identify the first temperature compensation value, the processing device is to access a data structure storing the plurality of temperature compensation values, wherein the plurality of temperature compensation values are based on specific characteristics of the first segment formed during fabrication of the at least one memory device; and adjust, based on an amount represented by the first temperature compensation value, an access control voltage applied to the memory cell.

16. The non-transitory computer-readable storage medium of claim 15, wherein the first segment of the memory system comprises a semiconductor die on which the at least one memory device having the memory cell is fabricated.

17. The non-transitory computer-readable storage medium of claim 16, wherein the current temperature associated with the memory cell comprises at least one of a temperature of the semiconductor die, an operating temperature of the memory system, or an ambient temperature.

18. The non-transitory computer-readable storage medium of claim 15, wherein the memory cell comprises a multi-level memory cell and is configured to store a voltage at one of a plurality of voltage levels, each of the plurality of voltage levels representing a different logical data value.

19. The non-transitory computer-readable storage medium of claim 18, wherein the data access request comprises a program request.

20. The non-transitory computer-readable storage medium of claim 18, wherein the data access request comprises a read request, and wherein the instructions further cause the processing device to:

measure an amount of current flow through the memory cell upon applying the access control voltage, as adjusted by the amount represented by the first temperature compensation value, to a control gate of the memory cell;

determine one of the plurality of voltage levels from the amount of current flow; and determine a logical data value corresponding to the one of the plurality of voltage levels.

* * * * *